US007565469B2

(12) United States Patent
Mylly et al.

(10) Patent No.: US 7,565,469 B2
(45) Date of Patent: Jul. 21, 2009

(54) MULTIMEDIA CARD INTERFACE METHOD, COMPUTER PROGRAM PRODUCT AND APPARATUS

(75) Inventors: Kimmo Mylly, Julkujarvi (FI); Jani Hyvönen, Tampere (FI)

(73) Assignee: Nokia Corporation, Espoo (FI)

( * ) Notice: Subject to any disclaimer, the term of this patent is extended or adjusted under 35 U.S.C. 154(b) by 125 days.

(21) Appl. No.: 11/250,711

(22) Filed: Oct. 14, 2005

(65) Prior Publication Data

US 2006/0103948 A1    May 18, 2006

Related U.S. Application Data

(60) Provisional application No. 60/629,098, filed on Nov. 17, 2004.

(51) Int. Cl.
G06F 13/42 (2006.01)
G06F 13/12 (2006.01)
H05K 7/10 (2006.01)

(52) U.S. Cl. .................... 710/105; 710/74; 710/301; 370/450; 711/103

(58) Field of Classification Search ............. 370/450, 370/454; 711/103
See application file for complete search history.

(56) References Cited

U.S. PATENT DOCUMENTS

| | | | |
|---|---|---|---|
| 6,279,114 B1 * | 8/2001 | Toombs et al. ............. 713/300 |
| 6,550,684 B1 * | 4/2003 | Zuin et al. ................. 235/486 |
| 6,917,992 B2 * | 7/2005 | Grimsrud et al. ............ 710/74 |
| 6,977,656 B1 * | 12/2005 | Lee ........................... 345/535 |
| 7,055,757 B2 * | 6/2006 | Nishizawa et al. .......... 235/492 |
| 7,177,975 B2 * | 2/2007 | Toombs et al. .............. 711/103 |
| 7,215,580 B2 * | 5/2007 | Gorobets .................. 365/189.02 |
| 7,243,185 B2 * | 7/2007 | See et al. .................. 711/103 |
| 2001/0016887 A1 * | 8/2001 | Toombs et al. .............. 710/102 |
| 2003/0051094 A1 | 3/2003 | Katayama et al. .......... 711/103 |

(Continued)

FOREIGN PATENT DOCUMENTS

EP    0 883 066 A2    12/1998

(Continued)

OTHER PUBLICATIONS

MultiMediaCard—retreived from the following website: http://en.wikipedia.org/wiki/Multimedia_Card—on Jul. 19, 2007—4 pages.*

(Continued)

*Primary Examiner*—Paul R Myers
*Assistant Examiner*—Brian T Misiura
(74) *Attorney, Agent, or Firm*—Harrington & Smith, PC

(57) ABSTRACT

A method to communicate data from a first unit to a second unit over a bus includes initiating an n-block data transfer, where n>1; for a first n−1 data blocks transferred from the first unit to the second unit, controlling a status signal generated by the second unit to be a buffer busy/ready status signal after each of the n−1 data blocks to inform the first unit of when the first unit may transfer the next data block; and for the $n^{th}$ data block transferred from the first unit to the second unit, controlling the status signal to be a programming busy/ready status signal after the $n^{th}$ data block to inform the first unit of a termination of internal programming, if any, by the second unit.

21 Claims, 1 Drawing Sheet

U.S. PATENT DOCUMENTS

| | | | |
|---|---|---|---|
| 2003/0061432 A1 | 3/2003 | Huppenthal et al. | 710/305 |
| 2004/0133717 A1* | 7/2004 | Tashiro | 710/72 |
| 2005/0223158 A1* | 10/2005 | See et al. | 711/103 |
| 2005/0268025 A1* | 12/2005 | Smith et al. | 711/103 |
| 2006/0077711 A1* | 4/2006 | Mylly | 365/185.17 |
| 2006/0103948 A1* | 5/2006 | Mylly et al. | 359/689 |

FOREIGN PATENT DOCUMENTS

| | | |
|---|---|---|
| EP | 1 411 705 A1 | 4/2004 |
| EP | 1 553 501 A1 | 7/2005 |
| WO | WO 2004/036440 A1 | 4/2004 |

OTHER PUBLICATIONS

The MultiMediaCard System Specification Version 3.1—Jun. 2001—130 pages.*

"Wider bus width, highest clock frequencies available, and dual voltage operation are ideal for cell phones and digital cameras", Cupertino, Tom Mahon, MultiMediaCard Specification Version 4.0 is Released, Feb. 2, 2004.

"The MultiMediaCard", System Specification Version 3.31, May 2003, only table of contents, pp. 1-10.

"The I2C-bus specification Version 2.1", Philips Semiconductors, Product Specification, Jan. 2000, pp. 1-46.

* cited by examiner

MULTIMEDIA CARD INTERFACE METHOD, COMPUTER PROGRAM PRODUCT AND APPARATUS

CLAIM OF PRIORITY FROM PROVISIONAL PATENT APPLICATION:

This patent application claims priority under 35 U.S.C. § 119(e) from copending U.S. Provisional Patent Application No.: US60/629,098, filed Nov. 17, 2004, the content of which is incorporated by reference herein in its entirety.

TECHNICAL FIELD

The exemplary embodiments of this invention relate generally to removable memory modules containing memory devices and, more specifically, relate to interfaces to removal memory modules such as, but not limited to, one known as a MultiMediaCard (MMC) and one known as a Secure Digital (SD) memory card.

BACKGROUND

In removable memory modules, such as the MMC, busy signaling is defined in relation to, for example, data programming. The busy signal is output from the MMC to a host device and is used to indicate, in this case: "buffer ready for next data". An erase command also uses the busy signal, but in this case it indicates "erase busy". As there is generally only one busy signal line present in order to conserve pin count, the usage of the busy signal is not flexible.

The current definition for the busy signal in the MMC Association (MMCA) System is based on the fact that the software layers of the host device are typically implemented in such a way that data is transferred in blocks, for example in 16 k byte blocks. It is thus practical to use so-called multiple block write commands, as one block of data transferred over the MMC interface is only a fraction of the host device block size (typically the MMC block is 512 bytes). As the meaning of the busy signal is currently, for the data transfer case, "buffer ready," the host may transfer multiple 512 byte blocks of data to the MMC without polling the status of the buffers.

However, as currently specified a problem is encountered in that after the last block has been transferred (e.g., the last 512 byte block of the total 16 k byte block) the host must begin polling a "programming ready" status signal, which becomes relevant at this point since there are no new blocks to be transferred. Requiring the host to poll the program ready status signal is an inefficient use of the host's processing capacity.

SUMMARY OF THE INVENTION

The foregoing and other problems are overcome, and other advantages are realized, in accordance with the exemplary embodiments of this invention.

In a first aspect thereof this invention provides a method to interface a first unit to a second unit over a bus that comprises a signal line. The method includes driving first information from the first unit to the second unit over the signal line; driving the signal line from the second unit to cause a change of state; interpreting the change of state of the signal line at the first unit to have a first meaning and in response driving second information to the signal line from the first unit; driving the signal line from the second unit to cause a change of state and interpreting the change of state of the signal line at the first unit to have a second meaning.

In a second aspect thereof this invention provides a computer program product contained in a computer-readable medium and comprised of program instructions for performing an operation of interfacing a first unit to a second unit over a bus that comprises a signal line. The operations include driving first information from the first unit to the second unit over the signal line; driving the signal line from the second unit to cause a change of state; interpreting the change of state of the signal line at the first unit to have a first meaning and in response driving second information to the signal line from the first unit; driving the signal line from the second unit to cause a change of state and interpreting the change of state of the signal line at the first unit to have a second meaning.

In a third aspect thereof this invention provides apparatus to interface a first unit to a second unit over a bus that comprises a signal line. The apparatus in this embodiment includes a driver at the first unit coupled to the signal line and a receiver at the first unit coupled to the signal line. The driver is operable to drive first information from the first unit to the second unit over the signal line and the receiver is operable to receive a change of state of the signal line driven from the second unit. A controller at the first unit is operable to interpret the change of state of the signal line to have a first meaning after driving the first information and to have a second meaning after driving second information from the first unit to the second unit over the signal line. The first unit may comprise a host and the second unit may comprise a memory card.

In a fourth third aspect thereof this invention provides apparatus to interface a first unit to a second unit over a bus that comprises a signal line. The apparatus in this embodiment includes a driver at the first unit coupled to the signal line and a receiver at the first unit coupled to the signal line. The receiver is operable to receive first information from the second unit over the signal line and the driver is operable to drive a change of state of the signal line to the second unit. A controller at the first unit causes the change of state of the signal line to have a first meaning after receiving the first information and to have a second meaning after receiving second information from the second unit over the signal line. The first unit may comprise a memory card and the second unit may comprise a host.

In a further aspect thereof this invention provides a method to communicate data from a first unit to a second unit over a bus. The method includes initiating an n-block data transfer, where n>1; for a first n−1 data blocks transferred from the first unit to the second unit, controlling a status signal generated by the second unit to be a buffer busy/ready status signal after each of the n−1 data blocks to inform the first unit of when the first unit may transfer the next data block; and for the $n^{th}$ data block transferred from the first unit to the second unit, controlling the status signal to be a programming busy/ready status signal after the $n^{th}$ data block to inform the first unit of a termination of internal programming, if any, by the second unit.

In a further aspect thereof this invention provides a computer program product contained in a computer-readable medium and comprised of program instructions for performing an operation of communicating data from a first unit to a second unit over a bus. The operations include initiating an n-block data transfer, where n>1; for a first n−1 data blocks transferred from the first unit to the second unit, controlling a status signal generated by the second unit to be a buffer busy/ready status signal after each of the n−1 data blocks to inform the first unit of when the first unit may transfer the next data block; and for the $n^{th}$ data block transferred from the first unit to the second unit, controlling the status signal to be a programming busy/ready status signal after the $n^{th}$ data block to inform the first unit of a termination of internal programming, if any, by the second unit. In a still further aspect thereof this invention provides apparatus to communicate data from a first unit to a second unit over a bus. The apparatus includes a controller to initiate an n-block data transfer, where n>1. For a first n−1 data blocks transferred from the first unit to the second unit the second unit controls a status signal to be a buffer busy/ready status signal after each of the n−1 data blocks to inform the first unit of when the first unit may transfer the next data block; and for the $n^{th}$ data block transferred from the first unit to the second unit the second unit controls the status signal to be a programming busy/ready status signal after the $n^{th}$ data block to inform the first unit of a termination of internal programming, if any, by the second unit.

In accordance with another mode of operation, the embodiments of this invention include a method, a computer program product and apparatus to communicate data from a first unit to a second unit over a bus. The method includes initiating an n-block data transfer, where n>1; for a first n−1 data blocks transferred from the first unit to the second unit, controlling a status signal generated by the second unit to be a buffer busy/ready status signal after each of the n−1 data blocks to inform the first unit of when the first unit may transfer the next data block; and after the $n^{th}$ data block transferred from the first unit to the second unit, sending a stop transmission command to the second unit, and controlling the status signal to be a programming busy/ready status signal to inform the first unit of a termination of internal programming, if any, by the second unit.

BRIEF DESCRIPTION OF THE DRAWINGS

The foregoing and other aspects of the exemplary embodiments of this invention are made more evident in the following Detailed Description, when read in conjunction with the attached Drawing Figures, wherein.

DETAILED DESCRIPTION OF THE INVENTION

Figure 1:
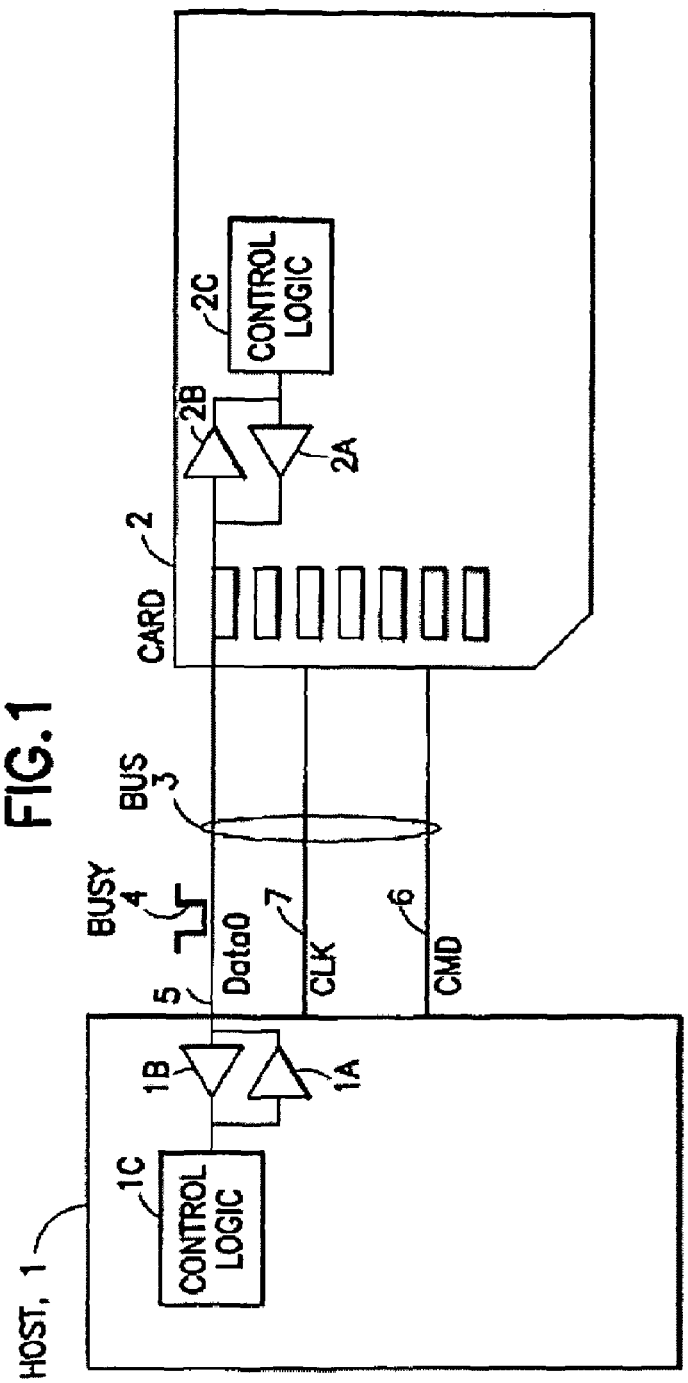
FIG. 1 is block diagram shown a first unit coupled to a second unit over a bus.

FIG. 1 shows a first unit, such as a host 1, connected to a second unit, such as a memory card 2 (e.g., a MMC), by a bus 3 that includes a busy signal 4 associated with a data line 5. Also shown are a command (CMD) line 6 over which the host 1 issues commands to the card 2, and a clock (CLK) line 7. In general, the bus 3 may be compatible with one defined as "The MultiMediaCard, System Specification, Version 3.31, MMCA Technical Committee", 2003, except as modified in accordance with the embodiments of this invention to provide the multiple-use or multi-mode busy signal 4. It should be appreciated, however, that the embodiments of this invention are not to be construed as being limited for use only with MMC-compatible cards, interfaces and buses.

The host 1 may be a cellular telephone, or a digital camera, or a PC, or any suitable device that can accommodate the use of the memory card 2. The host 1 is assumed to include a driver 1A and a receiver 1B coupled to the data signal line 5, and control logic 1C coupled to the driver 1A and the receiver 1B and operable in accordance with the teachings of this invention. The memory card 2 is assumed to include a driver 2A and a receiver 2B coupled to the data signal line 5, and control logic 2C coupled to the driver 2A and the receiver 2B and further operable in accordance with the teachings of this invention.

The exemplary embodiments of this invention provide for changing the meaning of the busy signal 4 during command execution. For the case of the MMC data transfer operation this implies that for the first data blocks sent the busy signal 4 is used and interpreted by the host 1 as defined currently (i.e., "buffer busy/ready"), but for the last data block the busy signal 4 is interpreted as "programming busy/ready". It should be noted that during the data transfer there may be data programming ongoing within the MMC 2. Thus, the "programming busy/ready" status signal is used to inform the host 1 when the internal programming of the memory card 2 is completed.

By the use of the exemplary embodiments of this invention there is no need for the host 1 to poll the internal "program busy/ready" status signal of the MMC 2, thereby conserving the host interface (IF) resources. Instead, the host 1 can continue to use the more efficient busy signal-based interrupt-driven mode of operation for the entire data transfer. In addition, the use of the embodiments of this invention implies that fewer software timers are required (such as those used to time a polling operation), thereby simplifying the implementation. The use of the embodiments of this invention also implies that performance enhancements can be realized; that backward and forward compatibility are made possible; and that parallel activity implementation usage is made possible in an effective manner.

Two exemplary modes of operation are now described. It should be appreciated that there are more than just these two modes of operation that are enabled by the use of the embodiments of this invention.

A first mode of operation is referred to as a multiple block write. For MMC-compatible operation the command sequence is as follows:

CMD16 (Set_Block_Length);
CMD23 (Set_Block_Count); from this information the MMC 2 can determine which block of data is the last block; and
CMD24 (Write_Block); write multiple blocks of data.

This command sequence is then followed by sending the data blocks on the data line 5 to the MMC 2. Between every data block there is busy signaling on the data line 5. The meaning of busy in this case is "buffer busy/ready". As soon as the busy signal is deasserted (goes high) the host 1 can send the next data block to the MMC 2. As was noted above, during the data transfer there may be data programming ongoing within the MMC 2. In accordance with an aspect of this invention after the MMC 2 receives the last data block it changes the meaning of the busy signal 4 to "programming busy/ready". This means that the host 1 does not need to begin polling the programming status of the MMC 2, but can instead continue to wait for a busy interrupt in this phase of the access as well. However, the occurrence of the busy interrupt is interpreted by the host 1 as an occurrence of the "programming ready" status indication.

A second mode of operation is referred to as an open ended multiple block write. For MMC-compatible operation the command sequence is as follows:

CMD16 (Set_Block_Length);
CMD25 (Write_Multiple_Block);
Sending of data blocks on data line 5; and
CMD12 (Stop_Transmission); from this information the MMC 2 knows that the last block of data has already been sent.

Between every data block there is busy signaling occurring on the data line 5. The meaning of busy in this case is "buffer busy/ready". As soon as the busy signal is deasserted the host 1 can send the next data block to the MMC 2. During the data transfer there may be data programming ongoing within the MMC 2. In accordance with an aspect of this invention after the MMC 2 receives the stop command (CMD12) it again sets the busy signal, but in this case the meaning of the busy signal 4 is again "programming busy/ready".

It can be noted that there are several possible timeslots during which the CMD12 can be sent to the MMC 2, and that these can affect the meaning and interpretation of the busy signal 4.

Figure 2:
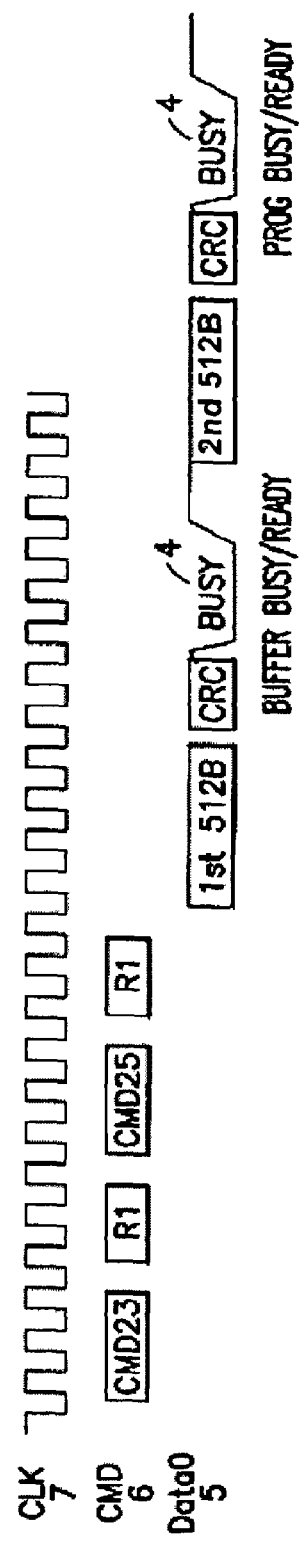
FIG. 2 is an exemplary waveform diagram that illustrates the operation of this invention.

FIG. 2 is a waveform diagram that illustrates a mode of operation wherein the CMD23 (Set_Block_Count) and CMD25 (Write_Multiple_Block) are sent on the CMD signal line 6, and shows the data line 5 conveying the first and last blocks of data, and the use of the dual-mode Busy signal 4 that is driven by the card 2 to indicate one of "buffer busy/ready" and "programming busy/ready".

As an alternative embodiment separate busy lines could be used for different types of status indications (e.g. in this case for buffer status and programming status). However, this approach would require more physical pins, and is not backwards compatible.

In contradistinction to previous uses for the busy signal 4, in accordance with aspects of this invention the meaning of the busy signal 4 is changed within the same command (e.g., the multiple block write) and between transferred data blocks.

It is within the scope of the exemplary embodiments of this invention for the host 1 to program the MMC 2 to select the mode of operation of the busy signaling. For example, at power-on reset the MMC 2 may default to the conventional use of the busy signaling, but may then be programmed by the host 1 to operate with the multi-mode use of the busy signaling (e.g., buffer busy/ready and programming busy/ready). Alternatively, the power-on mode of operation may be defined to be the multi-mode use of the busy signaling, and the host 1 may then program the MMC 2 to employ the conventional busy/ready signaling.

In one aspect thereof then the embodiments of this invention provide the memory card 2 that comprises a bus interface for coupling to the host 1 through the bus 3 that comprises the data signal line 5. The bus interface includes the driver 2A coupled to the data signal line and the receiver 2B also coupled to the data signal line 5. The receiver 2B is operable to receive first information from the host 1 over the data signal line 5. The driver 2A is operable to drive a change of state (as a transition of the busy signal 4) of the data signal line 5 to the host 1. The memory card 2 further includes the control logic or controller 2C that coupled to the driver 2A and to the receiver 2B and that is operable to cause the change of state of the data signal line 5 to have a first meaning (e.g., "buffer busy/ready") after receiving the first information and to have a second meaning (e.g., "programming busy/ready") after receiving second information from the host 1 over the data signal line 5.

The bus 3 further includes the command signal line 6, and the controller 2C is responsive to at least one command received through the command signal line 6 from the host 1 for causing the change of state of the data signal line 5 to have the first meaning after receiving the first information and to have the second meaning after receiving second information from the host 1 over the data signal line 5.

The controller 2C may be responsive to programming received from the host 1 for determining the meaning of the change of state of the data signal line 5 to have one of the first meaning after receiving the first information and to have the second meaning after receiving the second information from the host 1 over the data signal line, or to have the first meaning after receiving the first information and to also have the first meaning after receiving the second information from the host 1 over the data signal line 5.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims.

As but some examples of alternative embodiments, the use of other similar or equivalent signaling protocols and module types may be attempted by those skilled in the art. Further, the busy signal 4 can be made to assume more than two meanings during a single data transfer command. As an example, when transferring three data blocks the busy signal 4 could have a first meaning after the first data block is transferred, a second meaning after the second data block is transferred, and a third meaning after the third data block is transferred. Further in this regard, the busy signal can be used to indicate a plurality of different states during execution of a multi-phase command. For example, assume the use of a multi-phase erase command where address(es) to be erased are sent of the command line, and where the busy signal 4 indicates after the first address(es) are received that further address(es) can be sent, and after the last address(es) to be erased are sent the busy signal 4 indicates the erase status.

However, all such and similar modifications of the teachings of this invention will still fall within the scope of the embodiments of this invention.

Furthermore, some of the features of the exemplary embodiments of this invention may be used to advantage without the corresponding use of other features. As such, the foregoing description should be considered as merely illustrative of the principles, teachings and embodiments of this invention, and not in limitation thereof.

What is claimed is:

1. A method comprising:
    driving information comprising a first information portion and a second information portion from a first unit to a second unit over a bus having a signal line by:
    driving the first information portion from the first unit to the second unit over the signal line during a command execution;
    driving the signal line from the second unit to cause a change of state during the command execution;
    interpreting the change of state of the signal line at the first unit to have a first meaning and in response driving the second information portion to the signal line from the first unit during the command execution;
    driving the signal line from the second unit to cause again the change of state during the command execution; and
    interpreting at the first unit the change of state of the signal line occurring after driving the second information portion to the signal line to have a second meaning different from the first meaning.

2. A computer-readable medium embodying program instructions for performing operations, the operations comprising:
    driving information comprising a first information portion and a second information portion from a first unit to a second unit over a bus having a signal line by:

driving the first information portion from the first unit to the second unit over the signal line during a command execution;

driving the signal line from the second unit to cause a change of state during the command execution;

interpreting the change of state of the signal line at the first unit to have a first meaning and in response driving the second information portion to the signal line from the first unit during the command execution;

driving the signal line from the second unit to cause again the change of state during the command execution; and interpreting at the first unit the change of state of the signal line occurring after driving the second information portion to the signal line to have a second meaning different from the first meaning.

3. Apparatus to interface a first unit to a second unit over a bus that comprises a signal line, comprising:

a driver at said first unit coupled to said signal line and a receiver at said first unit coupled to the signal line, said driver being operable to drive information comprising a first information portion and then a second information portion from the first unit to the second unit over the signal line during a command execution, said receiver being operable to receive a change of state of the signal line driven from the second unit during the command execution both after receipt of the first information portion and after receipt of the second information portion at the second unit; and a controller at said first unit to interpret the change of state of the signal line to have a first meaning after the first information portion is driven by the driver during the command execution and to have a second meaning different from the first meaning after the second information portion is driven by the driver during the command execution from the first unit to the second unit over the signal line.

4. Apparatus as in claim 3, where said first unit comprises a host and where said second unit comprises a memory card.

5. Apparatus to interface a first unit to a second unit over a bus that comprises a signal line, comprising:

a driver at said first unit coupled to said signal line and a receiver at said first unit coupled to the signal line, said receiver being operable to receive information comprising a first information portion and then a second information portion from the second unit over the signal line during a command execution; said driver being operable to drive a change of state of the signal line to the second unit during the command execution both after receipt of the first information portion and after receipt of the second information portion; and a controller at said first unit to cause the change of state of the signal line to have a first meaning after receiving the first information portion during the command execution and to have a second meaning different from the first meaning after receiving the second information portion during the command execution from the second unit over the signal line.

6. Apparatus as in claim 5, where said first unit comprises a memory card and where said second unit comprises a host.

7. A method comprising:

communicating data from a first unit to a second unit over a bus by:

initiating an n-block data transfer with a multiple-block transfer command, where n>1;

for a first n−1 data blocks transferred from the first unit to the second unit, controlling a status signal generated by the second unit to be a buffer busy/ready status signal within the multiple-block transfer command after each of the n−1 data blocks to inform the first unit of when the first unit may transfer the next data block; and for the $n^{th}$ data block transferred from the first unit to the second unit, controlling said status signal to be a programming busy/ready status signal within the multiple-block transfer command after the $n^{th}$ data block to inform the first unit of a termination of internal programming, if any, by the second unit.

8. A method as in claim 7, where the first unit comprises a host, and where the second unit comprises a memory module.

9. A method as in claim 7, where the first unit comprises a cellular telephone, and where the second unit comprises a memory card.

10. A method as in claim 7, where said first unit receives said status signal after each of the n data blocks in an interrupt-driven mode of operation.

11. A computer-readable medium embodying program instructions for performing operations, the operations comprising:

communicating data from a first unit to a second unit over a bus by:

initiating an n-block data transfer with a multiple-block transfer command, where n>1;

for a first n−1 data blocks transferred from the first unit to the second unit, controlling a status signal generated by the second unit to be a buffer busy/ready status signal within the multiple-block transfer command after each of the n−1 data blocks to inform the first unit of when the first unit may transfer the next data block; and for the $n^{th}$ data block transferred from the first unit to the second unit, controlling said status signal to be a programming busy/ready status signal within the multiple-block transfer command after the $n^{th}$ data block to inform the first unit of a termination of internal programming, if any, by the second unit.

12. A computer program product as in claim 11, where the first unit comprises a host, and where the second unit comprises a memory module.

13. A computer program product as in claim 11, where the first unit comprises a cellular telephone, and where the second unit comprises a memory card.

14. A computer program product as in claim 11, where said first unit receives said status signal after each of the n data blocks in an interrupt-driven mode of operation.

15. Apparatus to communicate data from a first unit to a second unit over a bus, comprising:

a controller to initiate an n-block data transfer with a multiple-block transfer command, where n>1, where for a first n−1 data blocks transferred from the first unit to the second unit, said second unit controls a status signal to be a buffer busy/ready status signal within the multiple-block transfer command after each of the n−1 data blocks to inform the first unit of when the first unit may transfer the next data block; and for the $n^{th}$ data block transferred from the first unit to the second unit, said second unit controls said status signal to be a programming busy/ready status signal within the multiple-block transfer command after the $n^{th}$ data block to inform the first unit of a termination of internal programming, if any, by the second unit.

16. Apparatus as in claim 15, where the first unit comprises a host, and where the second unit comprises a memory module.

17. Apparatus as in claim 15, where the first unit comprises a cellular telephone, and where the second unit comprises a memory card.

18. Apparatus as in claim 15, where said first unit receives said status signal after each of the n data blocks in an interrupt-driven mode of operation.

19. A memory device comprising:
a bus interface configured to be coupled to a host through a bus having a data signal line, the bus interface further comprising a driver at said memory device coupled to said data signal line and a receiver at said memory device coupled to the data signal line, said receiver being operable to receive information comprising a first information portion and a second information portion from the host over the data signal line within a command execution; said driver being operable to drive a change of state of the data signal line to the host within the command execution; said bus interface further comprising a controller coupled to said driver and to said receiver and operable to cause the change of state of the data signal line to have a first meaning after receiving the first information portion within the command execution and to have a second meaning different from the first meaning after receiving the second information portion within the command execution from the host over the data signal line.

20. A memory device as in claim 19, where said bus is further comprised of a command signal line, and where the controller is responsive to at least one command for a multi-block transfer that initiates the command execution received through the command signal line from the host for causing the change of state of the data signal line to have the first meaning after receiving the first information portion and to have the second meaning after receiving second information portion from the host over the data signal line.

21. A memory device as in claim 19, where said controller is responsive to programming received from the host for determining the meaning of the change of state of the data signal line to have one of the first meaning after receiving the first information portion and to have the second meaning after receiving the second information portion from the host over the data signal line, or to have the first meaning after receiving the first information portion and to also have the first meaning after receiving the second information portion from the host over the data signal line.

* * * * *